(12) United States Patent
Raina et al.

(10) Patent No.: US 6,348,842 B1
(45) Date of Patent: Feb. 19, 2002

(54) METHOD AND APPARATUS FOR ACHIEVING ACCURATE TEMPERATURE-INVARIANT SAMPLING FREQUENCIES IN A MULTIPLE MESSAGE NON-VOLATILE MULTILEVEL ANALOG SIGNAL RECORDING AND PLAYBACK SYSTEM

(75) Inventors: Aditya Raina, San Jose; Peter J. Holzmann, Campbell; Geoffrey B. Jackson, Mountain View; Saleel V. Awsare, Redwood City, all of CA (US)

(73) Assignee: Winbond Electronics Corporation (TW)

( * ) Notice: Subject to any disclaimer, the term of this patent is extended or adjusted under 35 U.S.C. 154(b) by 0 days.

(21) Appl. No.: 09/696,564

(22) Filed: Oct. 25, 2000

(51) Int. Cl.[7] .................................................. H03L 1/02
(52) U.S. Cl. ........................... 331/176; 331/74; 331/77; 331/111; 331/143
(58) Field of Search ............................. 331/74, 77, 111, 331/143, 176

(56) References Cited

U.S. PATENT DOCUMENTS

| | | | |
|---|---|---|---|
| 5,352,934 A | | 10/1994 | Khan ....................... 307/296.1 |
| 5,933,370 A | | 8/1999 | Holzmann et al. ..... 365/189.05 |
| 5,963,105 A | * | 10/1999 | Nguyen ....................... 331/176 |
| 6,157,270 A | * | 12/2000 | Tso ............................. 331/176 |
| 6,191,660 B1 | * | 2/2001 | Mar et al. ................... 331/176 |

* cited by examiner

Primary Examiner—Siegfried H. Grimm
(74) Attorney, Agent, or Firm—Blakely, Sokoloff, Taylor & Zafman LLP

(57) ABSTRACT

An apparatus and method for achieving accurate temperature-invariant sampling frequencies in a device, such as, a multiple message non-volatile multilevel analog signal recording and playback system is described. An oscillator is used to generate an oscillation frequency. A bandgap voltage generator generates a zero temperature coefficient voltage reference (V(OTC)) that is independent of temperature. This V(OTC) is applied to the oscillator. A variable temperature coefficient voltage (V(TC)) that compensates for temperature coefficient variations of a resistor to which V(TC) is applied produces a stable oscillator current Iosc. Therefore, the stable oscillator current Iosc is likewise independent of the temperature coefficient variations of the resistor. The stable oscillator current Iosc is applied to the oscillator such that the oscillator generates a stable temperature-invariant oscillation frequency. A digital divider is used to digitally divide the stable oscillation frequency by a predetermined amount to produce an accurate temperature-invariant sampling frequency. A filter is then used to filter incoming signals utilizing a filter cutoff that tracks the sampling frequency.

24 Claims, 14 Drawing Sheets

Configuration Register 0

| Control Bit | Name | Block Affected | Description |
|---|---|---|---|
| CFG0<15> | AIG1 | ANAIN AMP | Gain set |
| CFG0<14> | AIG0 | ANAIN AMP | Gain set |
| CFG0<13> | AIPD | ANAIN AMP | Power down |
| CFG0<12> | AXG1 | AUXIN AMP | Gain set |
| CFG0<11> | AXG0 | AUXIN AMP | Gain set |
| CFG0<10> | AXPD | AUXIN AMP | Power down |
| CFG0<9> | INS0 | INPUT MUX | Input source select |
| CFG0<8> | AOS2 | ANAOUT MUX | Mux select |
| CFG0<7> | AOS1 | ANAOUT MUX | Mux select |
| CFG0<6> | AOS0 | ANAOUT MUX | Mux select |
| CFG0<5> | AOPD | ANAOUT AMP | Power down |
| CFG0<4> | OPS1 | OUTPUT MUX | Mux select |
| CFG0<3> | OPS0 | OUTPUT MUX | Mux select |
| CFG0<2> | OPA1 | OUTPUT AMPS | Amplifier/gain select |
| CFG0<1> | OPA0 | OUTPUT AMPS | Amplifier/gain select |
| CFG0<0> | VLPD | VOLUME CONTROL | Power down |

Configuration Register 1

| Control Bit | Name | Block Affected | Description |
|---|---|---|---|
| CFG1<15> | VLS1 | VOL MUX | Mux select |
| CFG1<14> | VLS0 | VOL MUX | Mux select |
| CFG1<13> | VOL2 | VOLUME CONTROL | Volume level |
| CFG1<12> | VOL1 | VOLUME CONTROL | Volume level |
| CFG1<11> | VOL0 | VOLUME CONTROL | Volume level |
| CFG1<10> | S1S1 | SUM1 MUX | Mux select |
| CFG1<9> | S1S0 | SUM1 MUX | Mux select |
| CFG1<8> | S1M1 | SUM1 AMP | Sum1 select |
| CFG1<7> | S1M0 | SUM1 AMP | Sum1 select |
| CFG1<6> | S2M1 | SUM2 AMP | Sum2 select |
| CFG1<5> | S2M0 | SUM2 AMP | Sum2 select |
| CFG1<4> | FLS0 | FILTER MUX | Mux select |
| CFG1<3> | FLD1 | FILTER CLOCK | Sample rate select |
| CFG1<2> | FLD0 | FILTER CLOCK | Sample rate select |
| CFG1<1> | FLPD | FILTER | Power down |
| CFG1<0> | AGPD | AGC AMP | Power down |

FIG. 4A

METHOD AND APPARATUS FOR ACHIEVING ACCURATE TEMPERATURE-INVARIANT SAMPLING FREQUENCIES IN A MULTIPLE MESSAGE NON-VOLATILE MULTILEVEL ANALOG SIGNAL RECORDING AND PLAYBACK SYSTEM

BACKGROUND

1. Field of the Invention

This invention relates generally to the field of integrated circuits. In particular, the invention relates to achieving accurate temperature-invariant sampling frequencies in an electronic device, such as, a multiple message non-volatile multilevel analog signal recording and playback system.

2. Description of Related Art

In a Sample Data System, there is always the need to band limit the incoming analog signal and sample it periodically. Band-limiting of the analog signal is performed through a suitable lowpass or a bandpass filter, and the periodic sampling is performed by sampling circuitry with an accurate periodic time-base. The periodic time base is generated from a suitable oscillator.

One form of monolithic implementation of a suitable filter is the continuous time active MOSFET-RC type. In a MOSFET-RC filter, MOSFET transistors are used in the non-saturation region with a control voltage on the gate to generate an effective resistance. Processing tolerances of integrated MOSFET transistor and capacitor parameters may create +−0.50% variation in the filter time constants. To maintain tight tolerances on the filter time constants, it becomes necessary to have a control loop, referenced to a stable reference, to control the time constants of the filter over process and ambient changes. In implementations where the time-base oscillator is also specified to be implemented in a monolithic form with the filter, the same process tolerances will create +−0.50% variations on the oscillator frequency. Also, in order to achieve an accurate and stable oscillation frequency, the oscillator needs to be referenced to a stable and accurate reference as part of the control loop, as well. Various systems and methods have been devised to accomplish this.

One such prior attempt, detailed in U.S. Pat. No. 5,352,934 issued to Khan, describes an integrated circuit system wherein both filter time constants and oscillator frequencies each utilize a suitable reference. Both the filter and the oscillator are referenced to common reference circuitry through a control loop. FIG. 1 shows a circuit, as implemented in Khan, for achieving variable sampling frequencies, in which, the filter cutoff frequency tracks the oscillator frequency. As will be discussed this approach has certain disadvantages.

As shown in FIG. 1, the current Iosc drives the oscillator 1. A current Ix, derived and related to Iosc, is used to produce a control voltage VCNTRL for the MOS resistor used in the MOSFET-RC filter 2. Thus, as the oscillator current (Iosc) is changed (e.g. as per change in sampling frequency), the gate voltage to the MOS devices is changed which modulates the resistance of these MOS devices which in turn tunes the cutoff of the continuous time MOSFET-RC filter 2. The conversion from the input current to the oscillator frequency and the conversion of the input current to the cut-off frequency includes numerous discrete components. Unfortunately, each component will have a certain process spread and this will cause undesirable variations in both the oscillator frequency and the cut-off frequency.

The oscillator current (Iosc), in the prior circuit of Kahn, is generated by a positive temperature coefficient (TC) current (denoted PTAT) from a proportional to absolute (PTAT) current generator 3 and a negative TC current (denoted NTC) using a negative TC generator 4. Both these currents are trimmable (i.e. they can be changed on chip by means of digital control signals derived from flash cells (e.g. storage cells)) within the temperature independent current generator 5. These trimmable positive TC currents and negative TC currents are fed into a tuning network to produce a stable oscillator current (Iosc) for the oscillator 1 and the related current Ix for the filter. The tuning network 6 sums the trimmed positive TC currents and negative TC currents together and adjusts the magnitudes of the currents also using trim bits.

Unfortunately, there is extensive mirroring of the currents involved in the above method. Every current mirror in the system introduces an error in the output current due to transistor mismatch. Thus, the more current mirrors that are used in the system, the wider the spread of the output currents from the positive and negative TC generators 3 and 4. Therefore, the more current mirrors that are used, the wider the distribution of the oscillator current (Iosc). Also, to achieve the desired sampling frequencies, the Iosc current is trimmed using trim bits in the tuning network 6 to achieve a proper Ix for the desired sampling frequency. Unfortunately, this means the oscillator frequency needs to be linear over a large frequency range. It should be noted, that the storage cells 7 (e.g. flash cells) are programmable such that they can output a logic one or a logic zero so that they can be used as digital control signals to fine-tune (or TRIM) the outputs of the respective blocks of the integrated circuit. This optimizes the integrated circuit's performance after manufacture without making a mask change. An example of the use of trim bits can be seen in U.S. Pat. No. 5,933,370 issued to Holzmann, et al.

Thus, the prior circuit of Khan, as illustrated in FIG. 1, suffers from certain disadvantages. As previously discussed, to achieve the different sampling frequencies, the oscillator frequency has to be varied. In order to achieve a stable oscillator frequency, the current driving the oscillator Iosc needs to be accurate. However, extensive mirroring is required to generate the oscillator current Iosc. Due to this extensive mirroring, even a slight mismatch between devices can create large errors in the oscillator current Iosc. This can cause the oscillator frequency to be inaccurate and can result in the filter cutoff, which is based on Ix in turn derived from Iosc, to vary drastically which can result in a poor Signal to Noise plus Distortion ratio (SINAD) and sound quality. Further, to achieve the different sampling frequencies the oscillator current Iosc has to be trimmed to achieve the proper Ix current and the right oscillator frequency, which means that the oscillator needs to operate linearly over a large frequency range. Also, the oscillator duty cycle can vary significantly due to mismatch between the devices.

Therefore, there is a need in the art for generating a stable oscillator current, utilizing a minimal amount of mirroring action, which can be used directly to generate the oscillator frequency.

SUMMARY OF THE INVENTION

An apparatus and method for achieving accurate temperature-invariant sampling frequencies in a device, such as, a multiple message non-volatile multilevel analog signal recording and playback system is described. An oscillator is used to generate an oscillation frequency. A bandgap voltage generator generates a zero temperature coefficient voltage reference (V(OTC)) that is independent of temperature. This V(OTC) is applied to the oscillator. A variable temperature coefficient voltage (V(TC)) that compensates for temperature coefficient variations of a resistor to which V(TC) is applied produces a stable oscillator current Iosc. Therefore, the stable oscillator current Iosc is likewise independent of the temperature coefficient variations of the resistor. The stable oscillator current Iosc is applied to the oscillator such that the oscillator generates a stable temperature-invariant oscillation frequency. A digital divider is used to digitally divide the stable oscillation frequency by a predetermined amount to produce an accurate temperature-invariant sampling frequency. A filter is then used to filter incoming signals utilizing a filter cutoff that tracks the sampling frequency.

In one embodiment of the present invention, the stable temperature-invariant oscillator frequency is a fixed frequency and a plurality of different sampling frequencies can be derived from the fixed oscillator frequency by simply digitally dividing the fixed oscillator frequency down to the desired accurate temperature-invariant sampling frequency. Because the oscillator is run at a fixed frequency, the oscillator can be optimized for a particular fixed frequency thus reducing the linearity requirement of the oscillator frequency over a large frequency range.

Advantageously, the stable temperature-invariant oscillator current that directly drives the oscillator is created utilizing a minimal amount of mirroring action such that variations in the oscillator current are minimized. Further, the oscillator current is used to directly generate the oscillator frequency which is digitally divided down into the desired accurate temperature-invariant sampling frequency thereby further eliminating errors due to component process variations. Also, in one embodiment, divider control bits are used to digitally divide the fixed oscillator frequency down to the desired sampling frequency. Additionally, since the oscillator frequency is digitally divided down to the desired sampling frequency, the requirement that the duty cycle of the oscillator be accurate is lessened.

Other features and advantages of the present invention will be set forth in part in the description which follows and the accompanying drawings, wherein the preferred embodiments of the present invention are described and shown, and in part will become apparent to those skilled in art upon examination of the following detailed description taken in conjunction with the accompanying drawings, or may be learned by the practice of the present invention. The advantages of the present invention may be realized and attained by means of the instrumentalities and combinations particularly pointed out in the appended claims.

BRIEF DESCRIPTION OF THE DRAWINGS

FIG. 4A illustrates a mapping of control bits of the configurations registers.

FIGS. 5A through 5I generally illustrate close-up views of circuits contained within the analog recording and playback system together with configuration register control bits that control the circuits therein.

FIG. 5E particularly illustrates a block diagram of a circuit of an internal clock for achieving accurate temperature-invariant sampling frequencies according to one embodiment of the present invention.

FIG. 5F illustrates a constant current relaxation oscillator that can be used with the present invention.

RELATED APPLICATIONS

Figure 1:
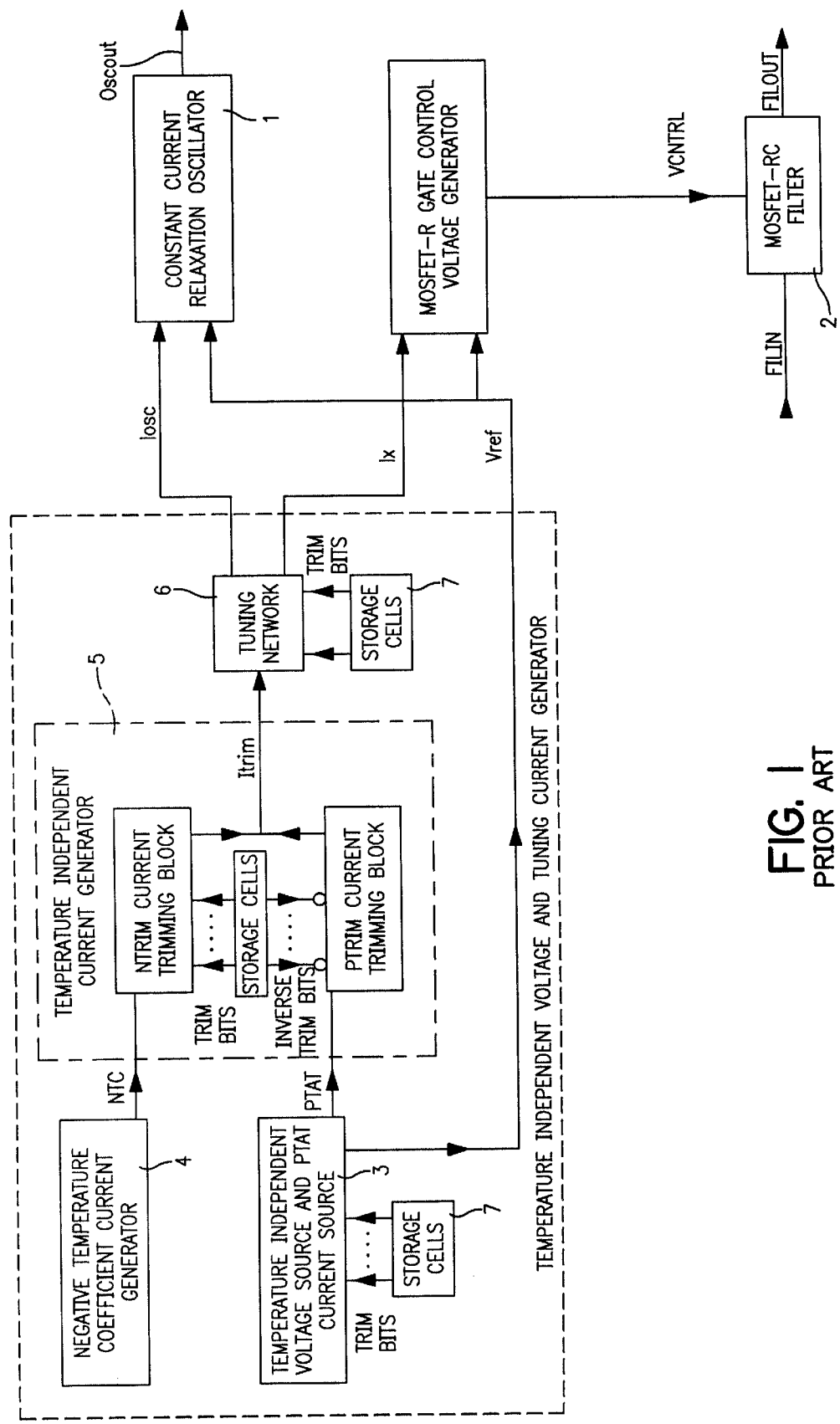
FIG. 1 is a diagram illustrating a prior circuit for achieving variable sampling frequencies, in which, the filter cutoff frequency tracks the oscillator frequency.

The contents of the co-pending U.S. patent application Ser. No. 09/184,454 entitled "A multiple message multilevel analog signal recording and playback system containing configurable analog processing functions", filed Nov. 2, 1998, assigned to the assignee of the present invention, are hereby incorporated by reference. Also, the contents of the co-pending U.S. patent application Ser. No. 09/501,699 entitled "Multiple message multilevel analog signal recording and playback system having memory array configurable for analog and digital storage and serial communication", filed Feb. 10, 2000, assigned to the assignee of the present invention, are hereby incorporated by reference.

DETAILED DESCRIPTION

In the following description, the various embodiments of the present invention will be described in detail. However, such details are included to facilitate understanding of the invention and to describe exemplary embodiments for implementing the invention. Such details should not be used to limit the invention to the particular embodiments described because other variations and embodiments are possible while staying within the scope of the invention. Furthermore, although numerous details are set forth in order to provide a thorough understanding of the present invention, it will be apparent to one skilled in the art that these specific details are not required in order to practice the present invention. In other instances details such as, well-known methods, procedures, components, electrical structures and circuits, are not described in detail, or are shown in block diagram form, in order not to obscure the present invention. Furthermore, the present invention will be described in particular embodiments but may be implemented in hardware, software, firmware, middleware, or a combination thereof.

In one embodiment, the present invention for achieving accurate temperature-invariant sampling frequencies can be utilized with a multiple message non-volatile multilevel analog signal recording and playback system. An analog processing circuit processes analog data. A storage circuit includes a non-volatile memory array, a switching circuit, and a communication interface. The non-volatile memory array stores analog and digital data. The switching circuit transfers the analog and digital data to and from the memory array. The communication interface allows an external processor to exchange information with the device.

In one embodiment, the analog processing circuit includes an apparatus and method for achieving accurate temperature-invariant sampling frequencies according to the present invention. An oscillator is used to generate an oscillation frequency. A bandgap voltage generator generates a zero temperature coefficient voltage reference (V(OTC)) that is independent of temperature. This V(OTC) is applied to the oscillator. A variable temperature coefficient voltage (V(TC)) that compensates for temperature coefficient variations of a resistor to which V(TC) is applied produces a stable oscillator current Iosc. Therefore, the stable oscillator current Iosc is likewise independent of the temperature coefficient variations of the resistor. The stable oscillator current Iosc is applied to the oscillator such that the oscillator generates a stable temperature-invariant oscillation frequency. A digital divider is used to digitally divide the stable oscillation frequency by a predetermined amount to produce an accurate temperature-invariant sampling frequency. A filter is then used to filter incoming signals utilizing a filter cutoff that tracks the sampling frequency.

In one embodiment of the present invention, the stable temperature-invariant oscillator frequency is a fixed frequency and a plurality of different sampling frequencies can be derived from the fixed oscillator frequency by simply digitally dividing the fixed oscillator frequency down to the desired accurate temperature-invariant sampling frequency. Because the oscillator is run at a fixed frequency, the oscillator can be optimized for a particular fixed frequency thus reducing the linearity requirement of the oscillator frequency over a large frequency range.

Figure 2:
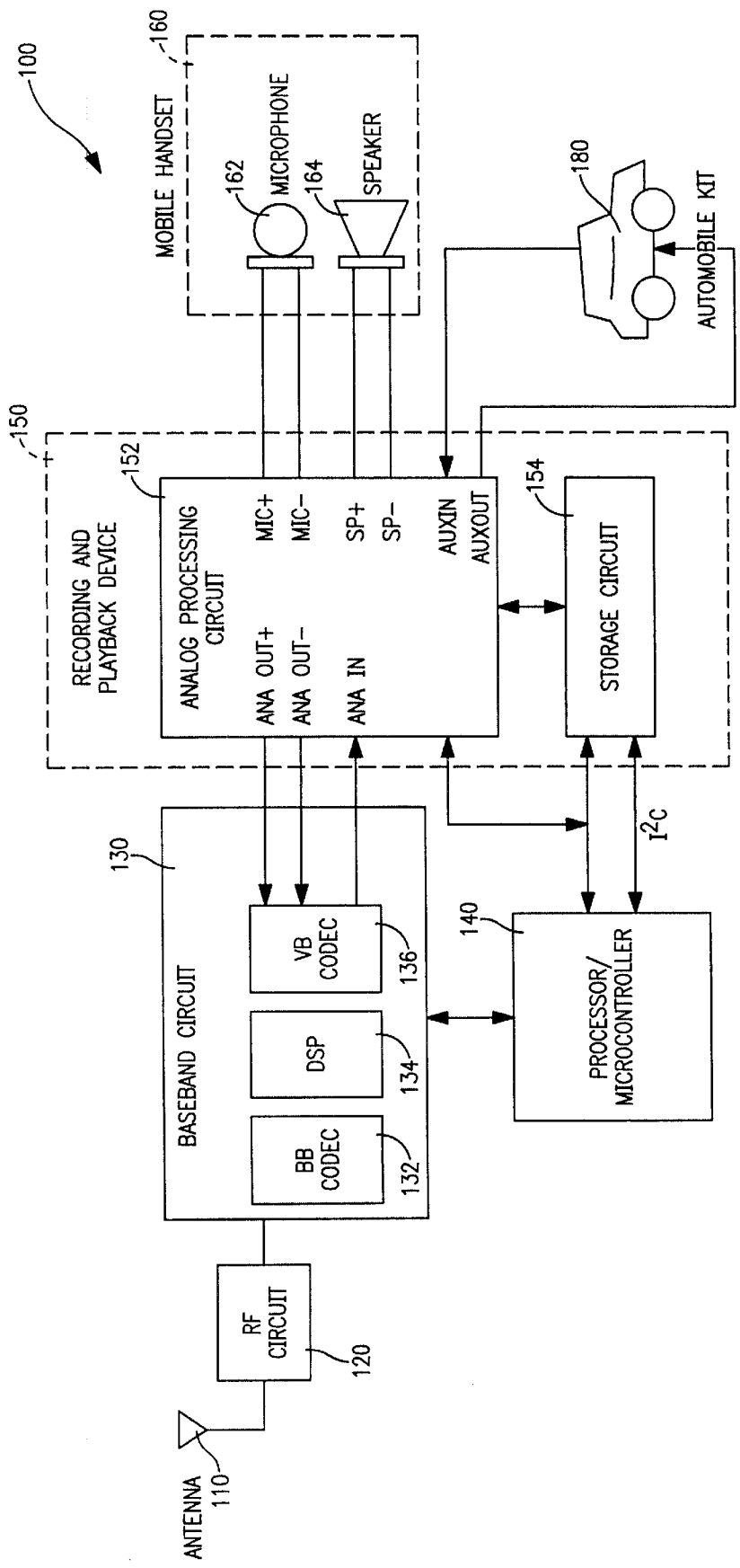
FIG. 2 is a diagram illustrating an exemplary system incorporating a recording and playback system, in which the present invention can be practiced.

FIG. 2 is a diagram illustrating an exemplary system 100 incorporating a recording and playback system according to one embodiment of the present invention. The exemplary system 100 is a mobile communication system. However, in other embodiments, the recording and playback system may be incorporated in, for example, telephone answering machines, cordless telephones, personal recorders, etc., to name a few. The system 100 includes an antenna 110, a radio frequency (RF) circuit 120, a baseband circuit 130, a processor 140, a recording and playback device 150, a mobile telephone handset 160, and an automobile kit 180.

The antenna 110 receives and transmits RF signals. The RF circuit 120 performs RF signal processing such as down conversion, filtering, and power amplification. The baseband circuit 130 performs signal processing functions at the baseband frequency. The baseband circuit 130 includes a baseband coder/decoder (BB CODEC) 132, a digital signal processor (DSP) 134, and a voiceband coder/decoder (VB CODEC) 136. The BB CODEC 132 interfaces with the RF circuit 120. The DSP 134 performs digital signal processing functions on the baseband signals from the BB CODEC 132 and VB CODEC 136. The VB CODEC 136 interfaces with the recording and playback device 150 for receiving and transmitting voice band signals. Analog-to-digital and digital-to-analog conversions are performed at appropriate places in the baseband circuit 130.

The processor 140 communicates with the baseband circuit and the recording and playback device to perform a number of functions such as control, monitoring, and configuration. The processor 140 is typically a microcontroller with sufficient program and data storage.

The recording and playback device 150 is an analog and digital subsystem that performs various analog signal processing functions, analog recording, analog playback, and digital storage. The recording and playback device 150 includes an analog processing circuit 152 and a storage circuit 154. In one embodiment, the recording and playback device 150 is implemented in a single integrated circuit.

The analog processing circuit system 152 provides analog outputs (ANA OUT+ and ANA OUT−), an analog input (ANA IN), microphone outputs (MIC+ and MIC−), speaker outputs (SP+ and SP−), an auxiliary output (AUX OUT) and an auxiliary input (AUX IN). The ANA OUT+ and ANA OUT− are coupled to the microphone inputs (MIC IN+ and MIC IN−) of the baseband circuit 130. The ANA IN is coupled to the speaker output (either SP OUT+ or SP OUT−) of the baseband circuit 130. The mobile telephone handset 160 includes a microphone 162 and a speaker 164. The MIC+ and MIC− are coupled to the microphone 162 and the SP+ and SP− are coupled to the speaker 164. The AUX IN and AUX OUT are interfaced to the automobile kit 180. The automobile kit 180 is the base portion of a mobile communication system that is installed in a vehicle. By way of example, a user may communicate to a remote caller by using the handset 160 or alternatively, the automobile kit interface 180. As herein described, downstream refers to communication originating from a remote location that is received from the antenna 110, through the baseband circuit 130, and to the device 150. On the other hand, upstream refers to communication originated from the handset 160 or the automobile kit interface 180, through the baseband circuit 130, the antenna 110, and to the remote location. The analog processing circuit 152 includes analog circuitry that provides multiple input and output paths, core analog processing sections, and volume control circuit. In one embodiment, the analog processing circuit 152 is described in the co-pending U.S. patent application Ser. No. 09/184,454 entitled "A multiple message multilevel analog signal recording and playback system containing configurable analog processing functions", filed Nov. 2, 1998, assigned to the assignee of the present invention.

The storage circuit 154 stores analog and digital data. The storage circuit 154 is interfaced to the analog processing circuit 152 and the processor 140. The storage circuit 154 stores analog data as processed by the analog processing circuit 152, and digital data as transferred from the processor 140 via a communication interface. The communication interface allows the processor 140 to exchange information with the recording and playback device 150. Examples of the information are commands, status, data, and addresses. In one embodiment, the storage circuit 154 is described in co-pending U.S. patent application Ser. No. 09/501,699 entitled "Multiple message multilevel analog signal recording and playback system having memory array configurable for analog and digital storage and serial communication", filed Feb. 10, 2000, assigned to the assignee of the present invention It should be appreciated by those skilled in the art that the apparatus and method for achieving accurate temperature-invariant sampling frequencies of the present invention can be used with Applicant's co-pending U.S. patent application Ser. No. 09/501,699 entitled "Multiple message multilevel analog signal recording and playback system having memory array configurable for analog and digital storage and serial communication" having storage circuit 154 for storing analog and digital data, or, Applicant's co-pending U.S. patent application Ser. No. 09/184,454 entitled "A multiple message multilevel analog signal recording and playback system containing configurable analog processing functions" which utilizes a multilevel storage array for storing analog data, or, any sample data system.

The present invention for an apparatus and method for achieving accurate temperature-invariant sampling frequencies will now be described an exemplary environment of the analog processing circuit system 152, which as previously discussed is particularly described in Applicant's co-pending United States Patent Application entitled "A multiple message multilevel analog signal recording and playback system containing configurable analog processing functions", for explanatory purposes only. However, it should be appreciated that Applicant's invention for achieving accurate temperature-invariant sampling frequencies can be used with any sample data system.

Figure 3:
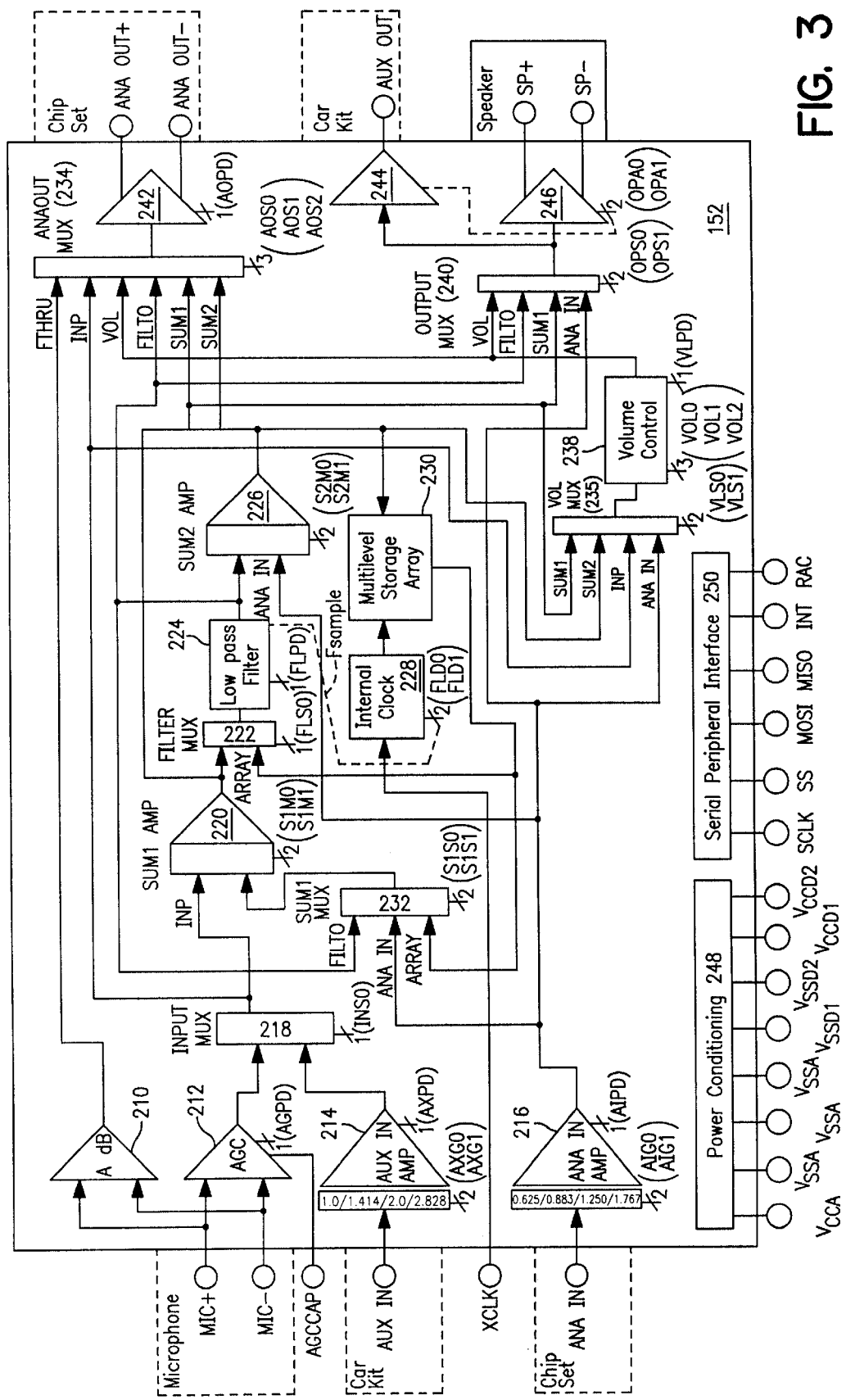
FIG. 3 illustrates a block diagram of the analog processing circuit system of FIG. 2, which provides an example of an environment, in which the present invention can also be practiced.

Turning back to the analog processing circuit system 152, FIG. 3 illustrates a block diagram of the analog recording and playback system 152 of FIG. 2 according to one embodiment of the present invention. Referring to FIG. 3, the system 152 includes five major sections, namely, multiple analog input and output paths, two core analog processing sections, a multilevel analog storage array, a serial peripheral interface, and a volume control circuit.

Power is supplied to the analog section, multilevel storage array, and digital section from separate VCC and VSS supply pins. In that regard, care is taken to minimize noise coupling between the analog and digital sections, not only from the power supplies, but also from the other signals, by way of the block diagram level design, circuit design, physical layout and pin outs, and board level designs utilizing the device. The voltage inputs (VCCA, VCCD1, and VCCD2) and ground inputs (VSSA, VSSD1, and VSSD2) are connected to a power conditioning circuit 248, which supplies regulated power to the circuits within the system 152. In a preferred embodiment, the voltage inputs VCCA and VCCD1–VCCD2 are +3 volts.

To minimize noise, the analog and digital circuits in the system 152 utilize separate power busses. The voltage inputs VCCA and VCCD1–VCCD2 supply the analog and digital circuits, respectively. To further minimize noise, the voltage inputs VCCD1 and VCCD2 power separate circuit, where one of the inputs (e.g., VCCD1) powers circuits that generate more noise (e.g., a charge pump circuit), while the other of the inputs (e.g., VCCD2) powers circuits that generate less noise. The ground inputs VSSA (three pins) and VSSD1–VSSD2, which are connected to the analog and digital circuits, respectively, are connected through a low-impedance path to power supply ground.

FIG. 4A illustrates a mapping of control bits of configurations registers, according to one embodiment of the present invention. These control bits control various signal paths, circuits, and controls within the analog recording and playback system 152. Loading of the configuration registers is as follows: If configuration register zero ("CFG0") is to be modified, a load CFG0 command byte and two data bytes are transmitted to an input shift register. The two data bytes are then transferred to CFG0. Next, configuration register one is loaded by transmitting a load CFG1 command byte and two data bytes to the input shift register. Once the data is shifted in, the two data bytes are transferred to CFG1. This latter command must be loaded into the device regardless of whether CFG1 is to be changed or not because changes to CFG0 do not take effect until CFG1 is loaded. The control bits in the configuration registers are grouped such that CFG0 contains parameters that are rarely changed. On the other hand, the control bits in the CFG1 contains parameters that are more likely to be changed. Thus, for the loaded values of CFG0 to take effect, CFG1 must be loaded. The parameters in CFG1 take effect immediately after CFG1 is loaded.

As will be described in more detail below, in one embodiment, there are five types of configuration bits. A first type includes power down bits which mask the global power down bit (C5) to select the blocks within the device to be powered up/down. The other types of configuration bits include MUX select bits for controlling the routing of analog paths within the device, sum select bits for controlling summing amplifiers, sample rate select bits for establishing the sample rate of the analog recording and the cut-off frequency of a filter, and volume level bits for setting the attenuation level of a volume control circuit.

Figure 5A:
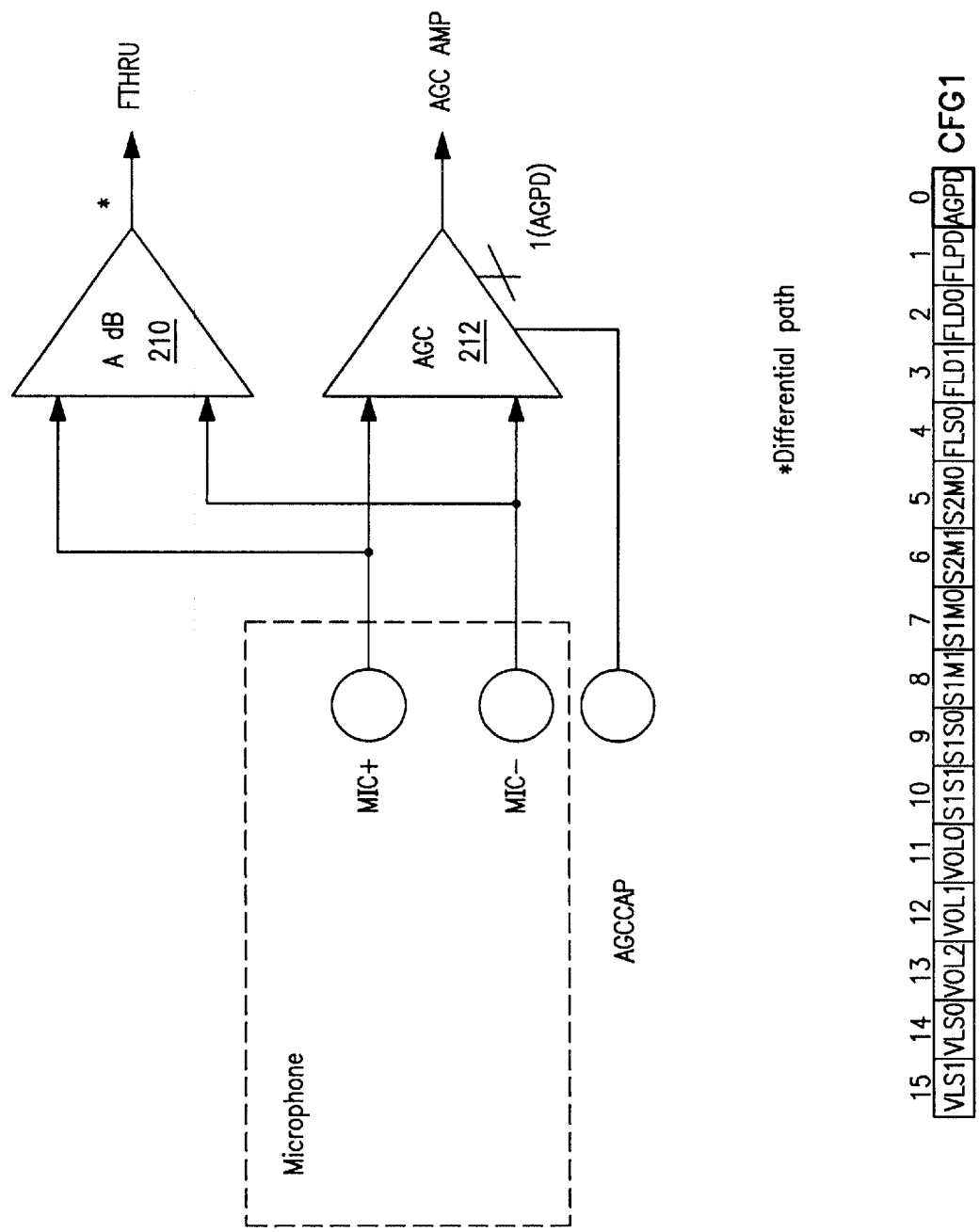

Referring back to FIG. 3, the device 152 comprises various signal inputs paths, namely, a microphone input path (microphone inputs MIC+ and MIC−), an auxiliary input path (AUX IN), and an analog input path (ANA IN). The microphone inputs MIC+ and MIC− are coupled to amplifiers 210 and 212. FIG. 5A illustrates a close-up view of the amplifiers 210 and 212 and the control bit in CFG1 that controls amplifier 212. Referring to FIGS. 3 and 5A, the microphone input (MIC+ and MIC−) has two separate paths. The first path is a feed-through path (FTHRU) and involves the amplifier 210, which has a fixed gain of A dB, where "A" is a positive number (e.g., 6 dB gain). The amplifier 210 is a high quality amplifier for passing an analog signal to the output of the device 152 without alteration or storage of the analog signal. This analog signal is passed to the baseband circuitry 110 of FIG. 2 for transmission upstream. This feed-through path will be described in more detail below. The second path, involving amplifier 212, is mainly used internally for storing an analog signal. The amplifier 212 includes automatic gain control ("AGC") feedback for producing a fixed signal level, which can then be stored in the multilevel analog storage array 230. An AGPD control signal line is coupled to the amplifier 212 for powering the amplifier up/down. Bit 0 of CFG1 controls the AGPD control signal. Also coupled to the amplifier 212 is an AGCCAP signal line which performs a peak detect function for both the AGC during record and the auto-mute feature during playback.

Figure 5B:
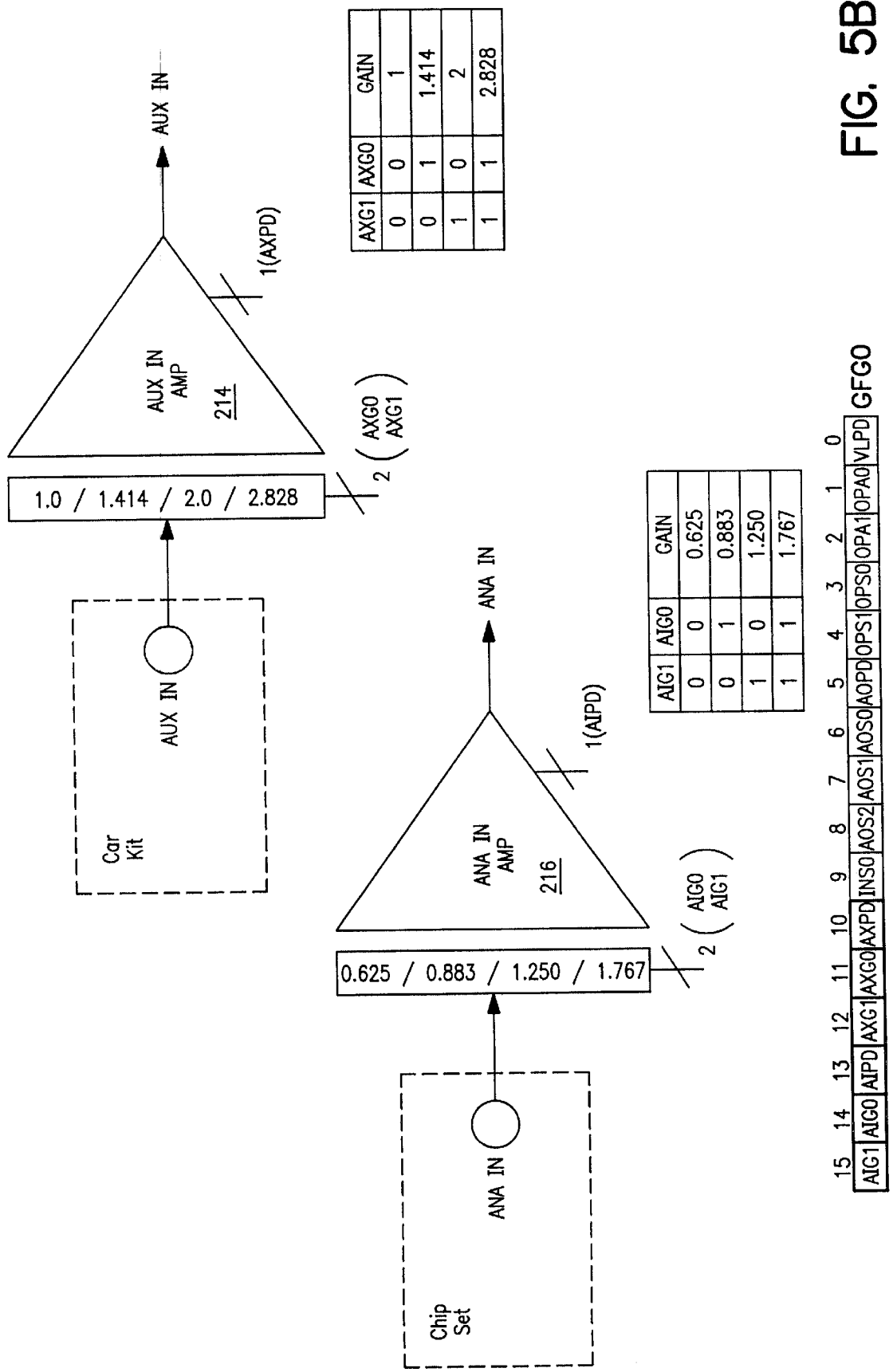

FIG. 5B illustrates the auxiliary input (AUX IN) and analog input (ANA IN) paths, and the bits in the CFG0 relating thereto. The auxiliary input AUX IN is coupled to variable gain amplifier 214 and the analog input ANA IN is coupled to variable gain amplifier 216. Variable gain amplifiers 214 and 216 are independently configurable, by setting bits in CFG0, to provide one of a plurality of gain levels. In the preferred embodiment, each amplifier is configurable to one of four gain levels, although a different number of gain levels may be provided. This allows the inputs to interface to a wide variety of signal levels. In particular, the auxiliary input AUX IN is designed to interface to a car kit interface (e.g., a signal on the order of hundreds of millivolts). The two signal lines AXG0 and AXG1, which are controlled by bits 11 and 12 of CFG0, control the gain of the amplifier 214. The analog input ANA IN is designed to interface to a baseband chip (e.g., a speaker driver output) or other high signal levels. The signal lines AIG0 and AIG1 control the gain of amplifier 216, which are controlled by bits 14 and 15 of CFG0.

In the preferred embodiment, the gain levels for amplifier 214 are 1, 1.414, 2, and 2.828, and the gain levels for amplifier 216 are 0.625, 0.883, 1.250, and 1.767, as shown in the chart of FIG. 5B. It is to be appreciated that other gain levels may be used depending on the input source level. An auxiliary input power down signal (AXPD) is coupled to the variable gain amplifier 214 for powering up/down the same. Bit 10 of CFG0 controls the power up/down state of amplifier 214. Similarly, an analog input power down signal (AIPD) is coupled to the variable gain amplifier 216 for powering up/down the same. Bit 13 of CFG0 controls the power up/down state of amplifier 216.

Figure 5C:
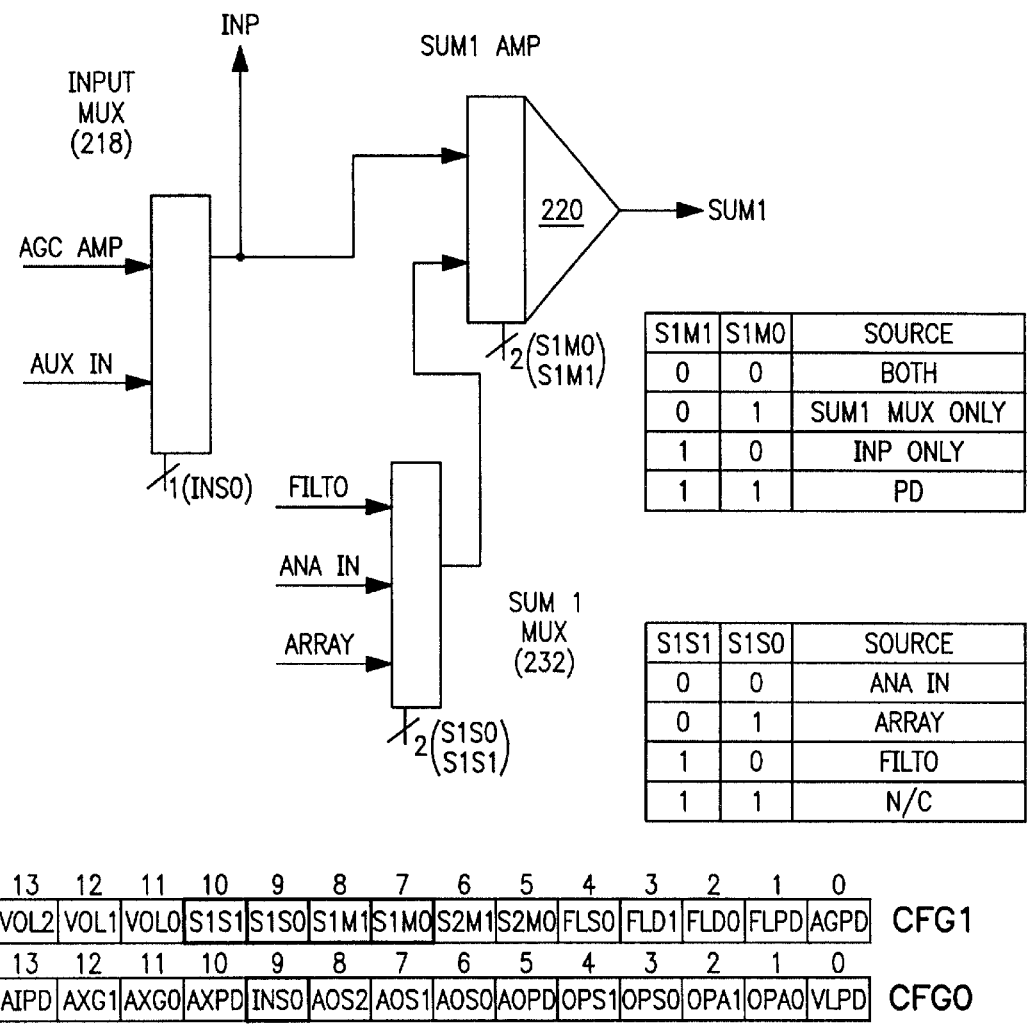

Referring now to FIGS. 5C, a first core portion of the analog recording and playback system 152 may be seen. The first core portion includes an input source multiplexer (INPUT MUX) 218, a first summing multiplexer (SUM1 MUX) 232, and a first summing amplifier (SUM1 AMP)

220. Referring to FIGS. 3 and 5C, the INPUT MUX 218 receives inputs AGC AMP and AUX IN from the AGC amplifier 212 and the variable gain amplifier 214, respectively. A control signal INS0, which is controlled by bit 9 of CFG 0, selects the input (i.e., the input source) that is passed to the output of the INPUT MUX 218. The INPUT MUX 218 is coupled to a first input of SUM1 AMP 220. The SUM1 MUX 232, which is a secondary source selector, selects one of three inputs that is passed to the output. The inputs include the ANA IN input from the variable gain amplifier 216, an ARRAY input (which is an output of the storage array 230), and a FILTO input (output of a low pass filter 224). The ARRAY input is a direct output of the storage array 230, and the FILTO is a filtered output of, for example, the storage array 230, as will be described in FIG. 5D. Control signals S1S0 and S1S1 determine the output of the SUM1 MUX 232, responsive to bits 9 and 10, respectively, of CFG 1.

The SUM1 MUX 232 is coupled to a second input of the SUM1 AMP 220. The SUM1 AMP 220 is a summing amplifier that operates in various modes. Control signals S1M0 and S1M1, responsive to bits 7 and 8, respectively, of CFG1, control the mode of the SUM1 AMP 220. In a first mode, the SUM1 AMP 220 mixes the inputs coupled thereto to provide a mixed analog output signal. In a second mode, the SUM1 AMP 220 operates as a buffer, passing one or the other input to the output. In a third mode, the SUM1 AMP 220 is in a power down condition. A chart showing the operating modes of the SUM1 AMP 220 is shown in FIG. 5C.

Figure 5D:
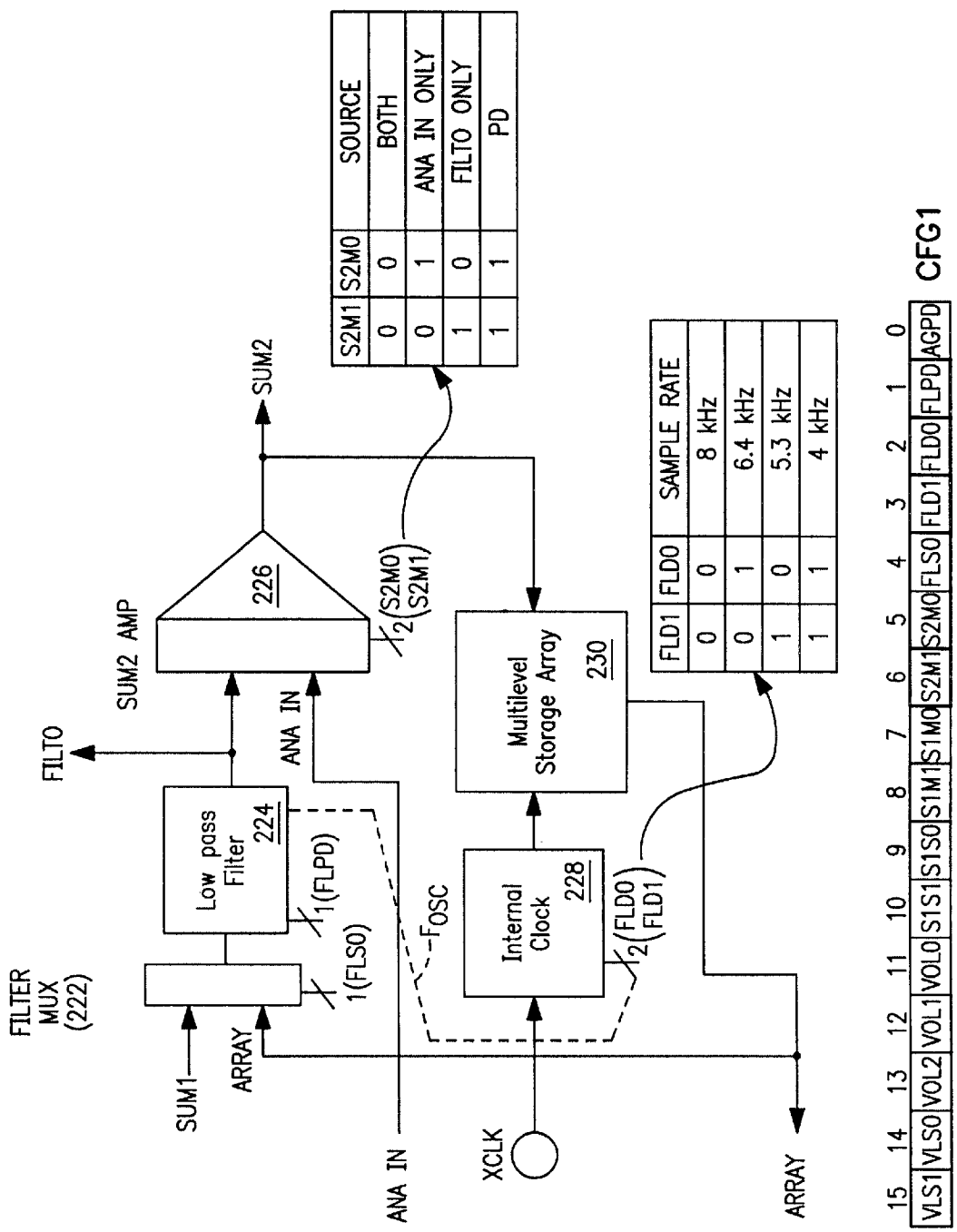

FIG. 5D illustrates a second core portion of the analog recording and playback system 152. The second core portion includes a filter multiplexer (FILTER MUX) 222, a low pass filter 224, a second summing amplifier (SUM2 AMP) 226, an internal clock circuit 228, and a multilevel analog storage array 230. This second core portion mainly involves recording and/or playback of analog signals. Referring to FIGS. 3 and 5D, the inputs to the FILTER MUX 222 include the SUM1 input (output of SUM1 AMP 220) and the ARRAY input (output of the storage array 230). Control signal FLS0, which is controlled by bit 4 of CFG1, determines the output of the FILTER MUX 222. The FILTER MUX 222 is coupled to the low pass filter 224 which is used for anti-aliasing and smoothing analog signals passing therethrough. Control signal FLPD, which is controlled by bit 1 of CFG1, is coupled to the low pass filter 224 for powering up/down the same. The output (FILTO) of the low pass filter 224 is coupled to a first input of the SUM2 AMP 226. The output of the variable gain amplifier 216 is coupled to a second input of the SUM2 AMP 226.

Similar to the SUM1 AMP 220, the SUM2 AMP 226 operates in various modes, responsive to control signals S2M0 and S2M1 coupled thereto. The control signals are controlled by bits 5 and 6 of CFG1. In a first mode, the SUM2 AMP 226 mixes the inputs coupled thereto to provide a mixed analog output signal. In a second mode, the SUM2 AMP 226 operates as a buffer, passing one or the other input to the output. In a third mode, the SUM2 AMP 226 is in a power down condition. A chart showing the operating modes of the SUM2 AMP 226 is shown in FIG. 5D. One instance, where both summing amplifiers SUM1 AMP 220 and SUM2 AMP 226 are used for mixing signals, involves a situation where a user, who is on the telephone with a remote caller, plays a recorded message (stored in the storage array 230) to the remote caller. This scenario, among numerous other scenarios, will be described in more detail below.

The SUM2 AMP 226 is coupled to the multilevel analog storage array 230. The recording technique, column drivers, and corresponding circuitry of the storage array 230 are substantially identical to the storage array described in co-pending application Ser. No. 09/115,442. In one embodiment, the storage array 230 includes 1200 rows and 1600 columns of analog storage cells. Each storage cell stores one of a plurality of discrete voltage levels (e.g., 256 levels).

Clocking of the storage array 230 is derived either from an internal clock 228 or, alternatively, from an external clock coupled to the XCLK pin. The clock sets the sample rate of the storage array. Control bits FLD0 and FLD1, which are controlled by bits 2 and 3 of CFG1, are coupled to the internal clock 228 to set the sample rate. In one embodiment, the internal clock 228 provides one of four sample rates (e.g., 4, 5.3, 6.4, or 8 kHz). Other sample rates may be provided, depending on design choice. The control bits FLD0 and FLD1 are also coupled to the low pass filter 224 for changing the cut-off frequency as the sample rate changes.

For example, in an answering machine application, a high quality 8 kHz sample rate is used for an outgoing message, and a lower quality sample rate (e.g., 4 kHz) is used for incoming messages to increase the amount of recording time available. The incoming messages can also be stored as high quality. However, if the free memory space decreases, the sample rate of the storage array 230 can be adaptively changed to maximize the remaining free storage space. Each new message starts at the beginning of a new row, so that each message can have a different sample rate.

Figure 5E:
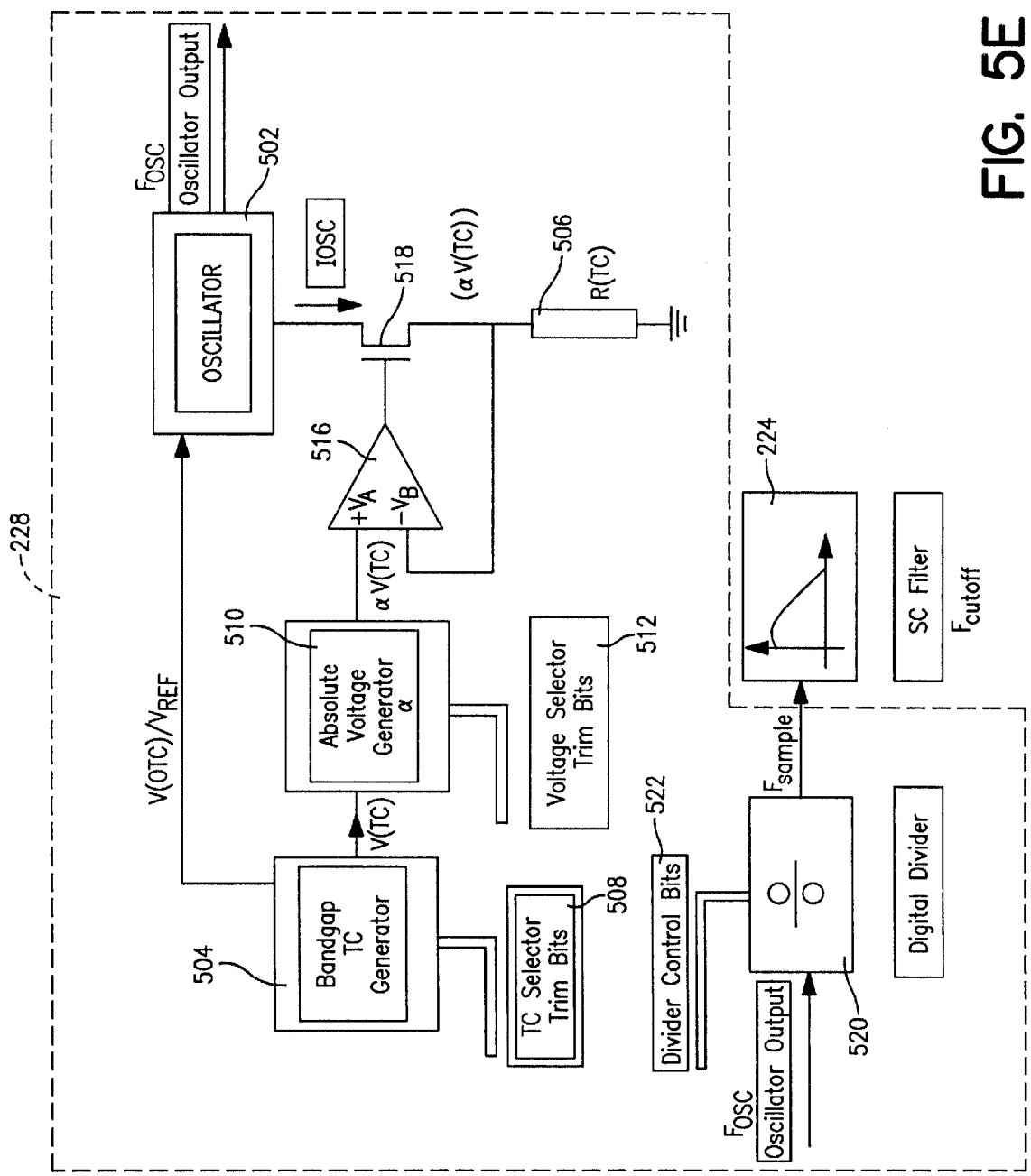

FIG. 5E illustrates a block diagram of the internal clock 228 for achieving accurate temperature-invariant sampling frequencies for the previously described device 152 according to one embodiment of the present invention. As shown in FIG. 5E, an oscillator 502 is used to generate an oscillation frequency Fosc. Oscillators to serve this purpose are well known in the art. For example, in one embodiment, the oscillator 502 can be a constant current relaxation oscillator as disclosed in U.S. Pat. No. 5,352,934 entitled "Integrated Mosfet Resistance and Oscillator Frequency Control Trim Methods and Apparatus", issued Oct. 4, 1994, assigned to the assignee of the present invention, the contents of which are hereby incorporated by reference.

Figure 5F:
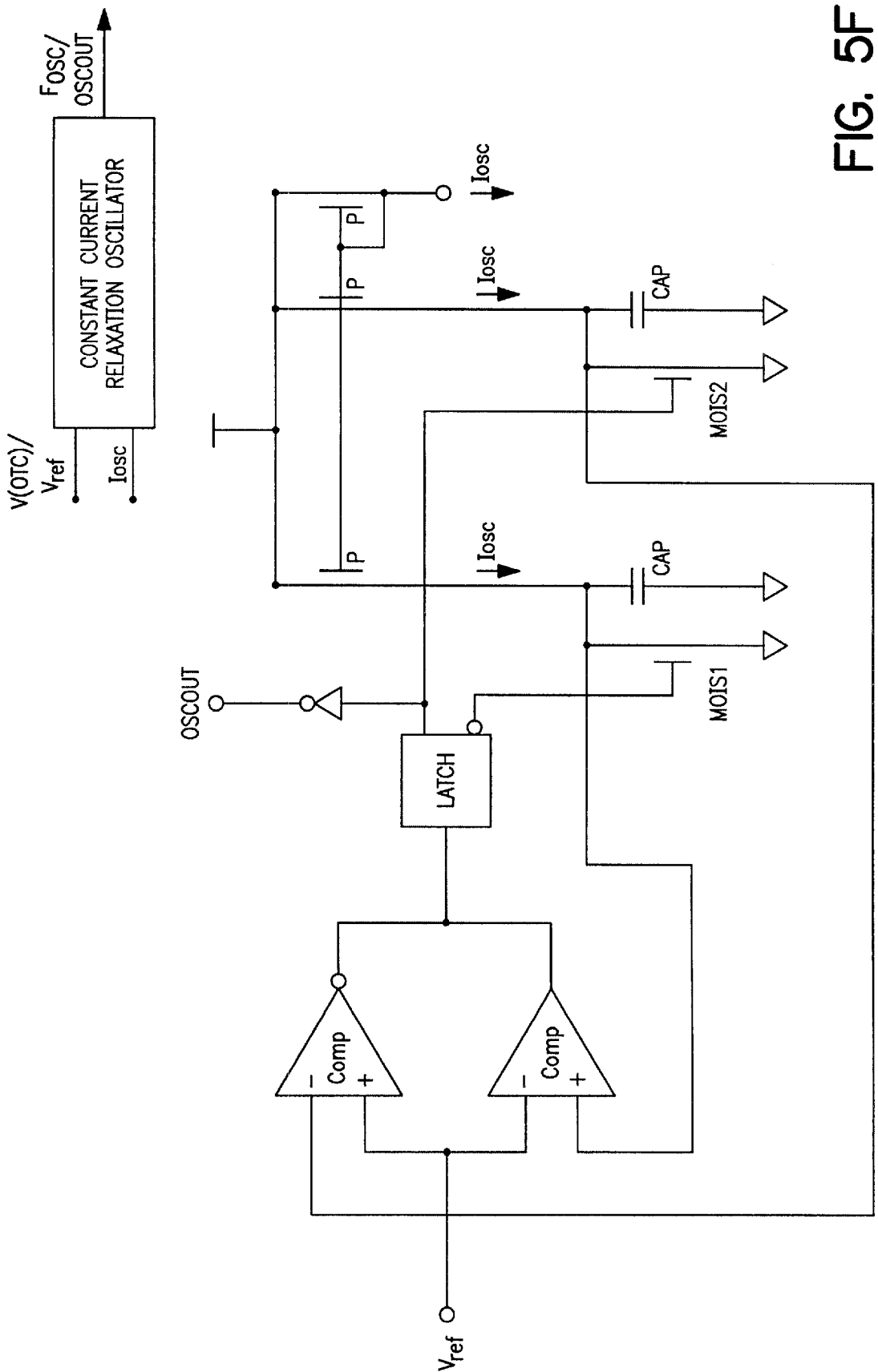

Referring briefly to FIG. 5F, in this embodiment, the constant current relaxation oscillator 502 operates on the principle that a pair of capacitors are alternately charged (each from a discharged state) through a constant current (Iosc) to a certain fixed zero temperature coefficient voltage reference (termed V(OTC) or Vref) that is independent of temperature. When one of the capacitors reaches Vref, a comparator detects the condition and then turns on the discharge circuitry for this capacitor. At the same time the other capacitor is released from the discharged state to charge up to Vref. The alternating periodic charging and discharging of the pair of capacitors gives the behavior of the oscillator 502.

The equation governing the oscillation frequency Fosc is:

$$Fosc = \frac{Iosc}{2 \cdot C \cdot V(OTC)}$$

Where:
Iosc=constant current through capacitors charged to Vref
Vref/V(OTC)=Fixed voltage to which capacitors charge
C=Capacitor value (each capacitor) which is a constant
Returning to FIG. 5E, a bandgap TC voltage generator 504 generates a zero temperature coefficient voltage reference (termed V(OTC) or Vref) that is independent of temperature. This V(OTC) is applied to the oscillator. The bandgap generator 504 generates V(OTC) with a high power supply rejection ratio. Such bandgap TC voltage generators are well known in the art. For example, a bandgap voltage generator similar to the one disclosed in U.S. Pat. No. 5,352,934 can be used.

The bandgap TC voltage generator 504 also generates a variable temperature coefficient voltage (V(TC)) that compensates for temperature coefficient variations of a resistor 506 (termed R(TC)) to which V(TC) is applied, such that V(TC) tracks R(TC). Accordingly, a stable oscillator current Iosc is produced. Therefore, the stable oscillator current Iosc is likewise independent of the temperature coefficient variations of the resistor 506. The bandgap voltage generator 504 uses temperature coefficient (TC) selector trim bits 508 to vary V(TC) to compensate for the temperature coefficient (TC) variations in the resistor. It should be noted, that programmable storage cells (e.g. flash cells) are utilized in producing the temperature coefficient (TC) selector trim bits 508 such that they can output a logic one or a logic zero so that they can be used as digital control signals to fine-tune (or TRIM) the output of the bandgap TC voltage generator 504. Such bandgap TC voltage generators are well known in the art. For example, a bandgap voltage generator similar to the one disclosed in U.S. Pat. No. 5,352,934 can be used.

The internal clock 228 further includes an absolute voltage generator 510 coupled to the bandgap voltage generator 504. The absolute voltage generator 510 varies the magnitude of V(TC) to compensate for the magnitude variations in the resistor. The absolute voltage generator 510 is basically an amplifier with a variable gain (e.g. utilizing an operational amplifier with variable gain). The absolute voltage generator 510 uses voltage selector trim bits 512 to select the amount of gain by which to amplify V(TC) yielding an output of αV(TC). Again, as with the bandgap TC voltage generator 504, programmable storage cells (e.g. flash cells) are utilized in producing the voltage selector trim bits 512 such that they can output a logic one or a logic zero so that they can be used as digital control signals to vary the gain of the absolute voltage generator 510.

A unity gain source follower operational amplifier 516 connected to a MOSFET 518 is coupled between the absolute voltage generator 510 and the oscillator 502 and the resistor 506. Voltage αV(TC) is applied across resistor 506 and the MOSFET 518 draws oscillator current Iosc from the oscillator 502. Oscillator 502 internally mirrors Iosc which it uses as the basis for generating the oscillator output, i.e. the stable temperature-invariant oscillation frequency Fosc. The unity gain source follower operational amplifier 516 ensures that VA=VB such that Iosc remains constant despite the temperature coefficient (TC) variations of the resistor. The stable oscillator current Iosc is applied to the oscillator 502 such that the oscillator generates a stable temperature-invariant oscillation frequency Fosc. Particularly, since the equation governing the oscillation frequency Fosc is:

$$Fosc = \frac{Iosc}{2 \cdot C \cdot V(OTC)}$$

Where:

$$Iosc = \frac{\alpha V(TC)}{R(TC)}$$

the equation governing the oscillation frequency Fosc becomes:

$$Fosc = \frac{\alpha \cdot V(TC)}{2 \cdot C \cdot R(TC) \cdot V(OTC)}$$

Where:
α=gain of the absolute voltage generator which is a constant V(OTC)=Fixed voltage to which capacitors charge which is a constant
C=Capacitor value (each capacitor) which is a constant Further, because V(TC) and R(TC) track each other, V(TC) being continuously varied to compensate for the temperature coefficient (TC) variations in the resistor, as seen by the above equations, the oscillator frequency Fosc is constant across temperature and a stable temperature-invariant oscillation frequency Fosc is created by the oscillator 502.

The internal clock 228 further includes a digital divider 520 coupled to the oscillator 502. The digital divider 520 is used to digitally divide the stable oscillation frequency Fosc by a predetermined amount to produce an accurate temperature-invariant sampling frequency Fsample. In one embodiment, the digital divider uses divider control bits 522 to digitally divide the stable temperature-invariant oscillator frequency Fosc to achieve the accurate temperature-invariant sampling frequency Fsample. Thus, the digital divider 520 acts a frequency divider. Again, as with the bandgap TC voltage generator 510, programmable storage cells (e.g. flash cells) are utilized in producing the divider control bits such that they can output a logic one or a logic zero so that they can be used as digital control signals to provide a predetermined amount (N) by which to divide the oscillator frequency Fosc. The equation that governs this is:
Fsample=

$$\frac{Fosc}{N}$$

(N is set by digital divider control bits) Again, since Fosc is derived from Iosc which is compensated for and largely independent of temperature variations, Fsample which is derived from Fosc is also largely independent of temperature variations and thus provides a very stable sampling frequency Fsample.

In one embodiment of the present invention, the stable temperature-invariant oscillator frequency Fosc is a fixed frequency, determined by a fixed stable temperature-invariant oscillator current Iosc. A plurality of different sampling frequencies Fsamples (e.g., 4, 5.3, 6.4, or 8 kHz) can be derived from the fixed oscillator frequency Fosc by simply digitally dividing the fixed oscillator frequency down to the desired accurate likewise temperature-invariant sampling frequency Fsample. Because the oscillator 502 is run at a fixed frequency, the oscillator can be optimized for a particular fixed frequency thus reducing the linearity requirement of the oscillator frequency over a large frequency range.

Finally, Fsample is passed to lowpass filter 224 which is used to filter incoming signals utilizing a filter cutoff that tracks the sampling frequency. In one embodiment, the lowpass filter 224 is a lowpass switched capacitor filter. The filter cutoff is proportional to the sampling frequency and is governed by the equation:

$$Fcutoff = \alpha * Fsample$$

Advantageously, the stable temperature-invariant oscillator current Iosc that directly drives the oscillator is created utilizing a minimal amount of mirroring action such that variations in the oscillator current are minimized. Further, since Fosc is derived from Iosc which is compensated for and largely independent of temperature variations, as previously discussed, Fsample which is derived from Fosc is also largely independent of temperature variations and thus provides a very stable largely temperature-invariant sampling frequency providing a very accurate sampling frequency needed in today's high end electronic sampled data systems, such as, multiple message multilevel analog signal recording and playback systems. Also, because the stable temperature-invariant oscillator current Iosc is used to directly generate the oscillator frequency Fosc, which is directly digitally divided down into the desired accurate temperature-invariant sampling frequency, further errors due to component process variations are eliminated due to the simplicity of the system.

Figure 5G:
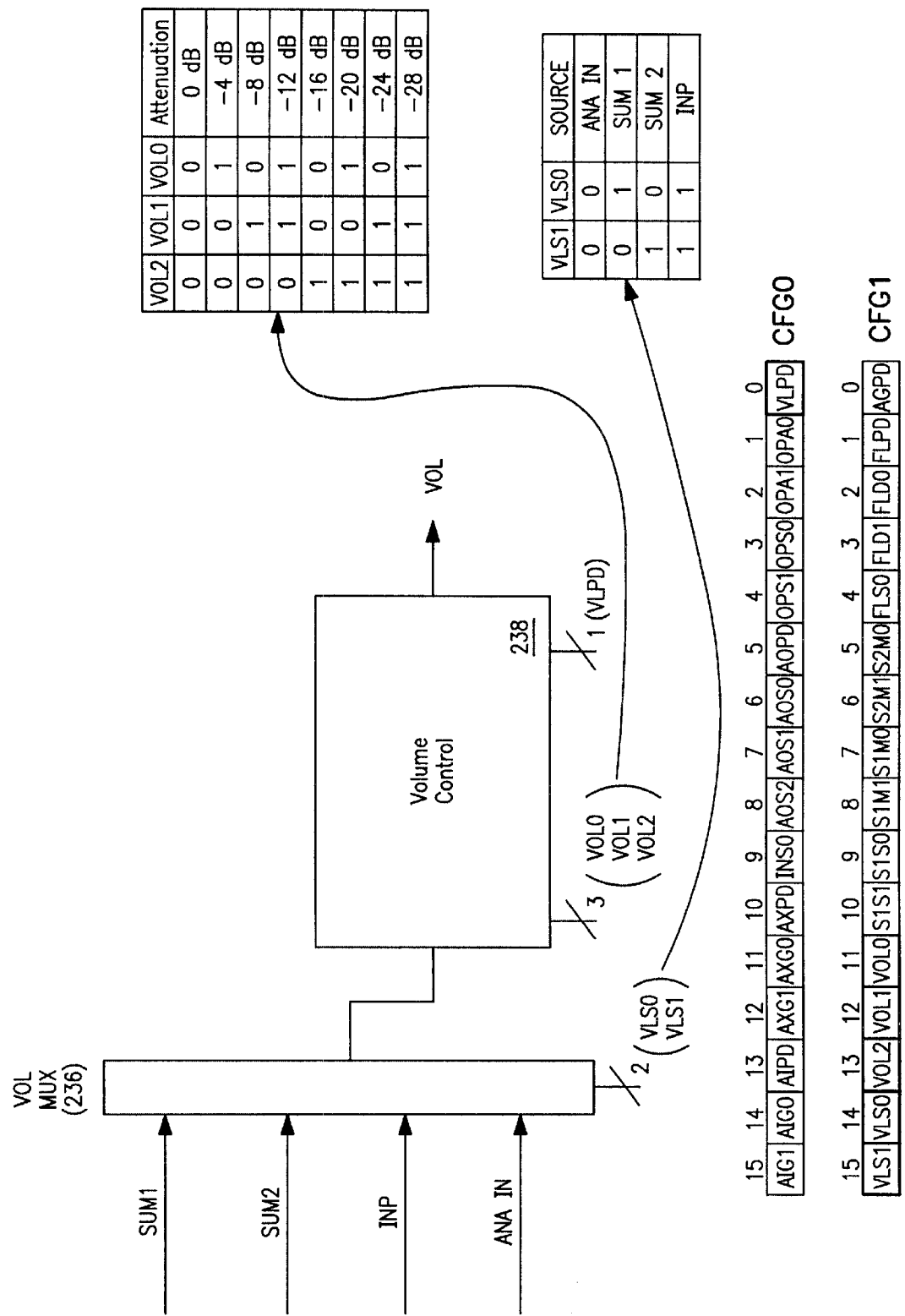

FIG. 5G illustrates a volume control circuitry of the analog recording and playback system 152. This circuit includes a volume multiplexer (VOL MUX) 236 and a volume control circuit 238. Referring to FIGS. 3 and 5G, control signals VLS0 and VLS1, controlled by bits 14 and 15 of CFG1, are coupled to the VOL MUX 236 for selecting one of four possible inputs as an output. The inputs to the VOL MUX 236 include SUM1 (output of SUM1 AMP 220), SUM2 (output of SUM2 AMP 226), INP (output of INPUT MUX 218), and ANA IN (output of variable gain amplifier 216). The VOL MUX 236 is coupled to the volume control circuit 238. Control signals VOL0–VOL2 are coupled to the volume control circuit 238, responsive to corresponding bits 11–13 of CFG1. The control signals VOL0–VOL2 control the attenuation factor of analog signals provided to the input of the volume control circuit 238 (e.g., one of eight volume levels). A VLPD signal, controlled by bit 0 of CFG0, is also coupled to the volume control circuit 238 to power down/up the same.

Figure 5H:
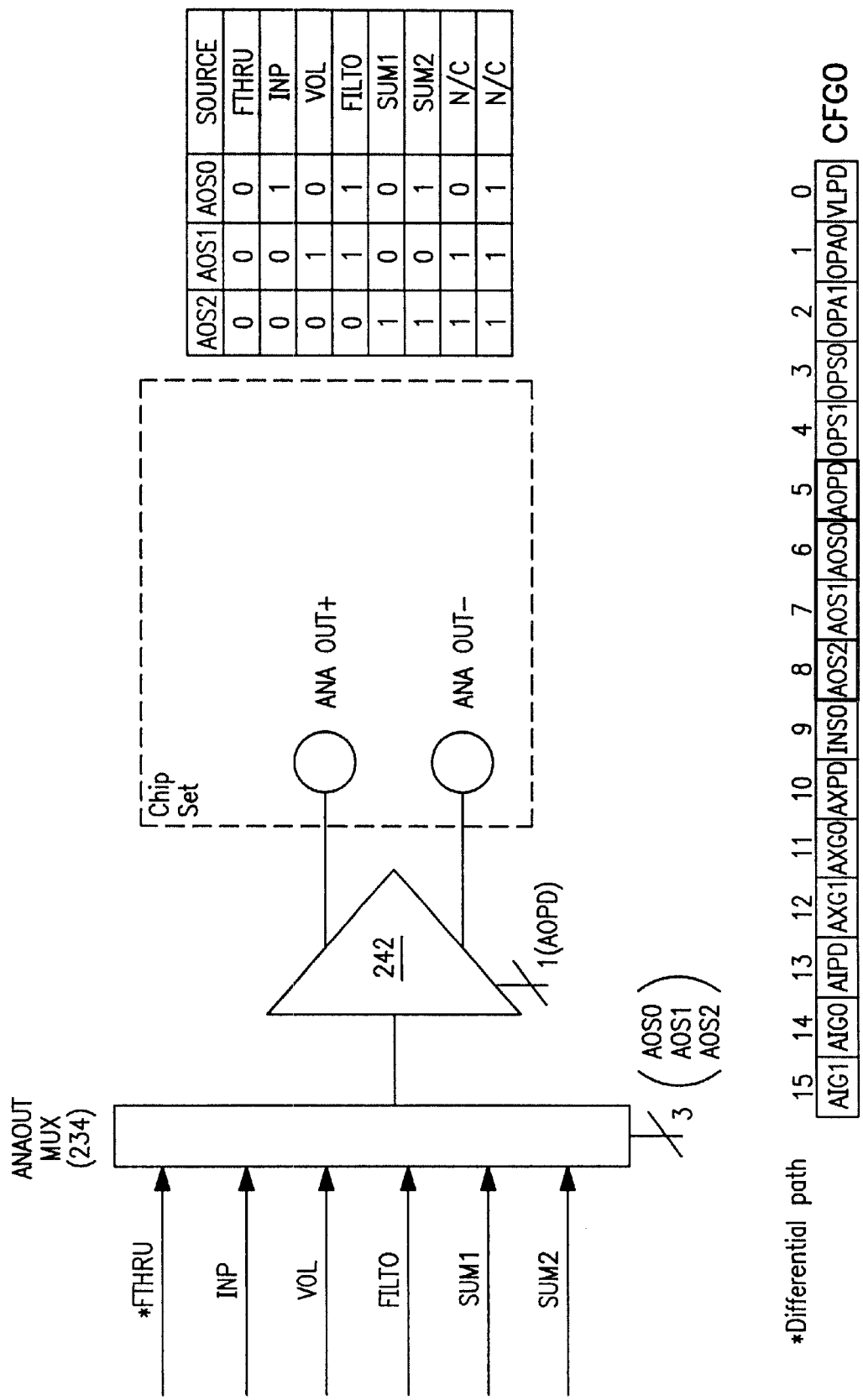
Figure 51:
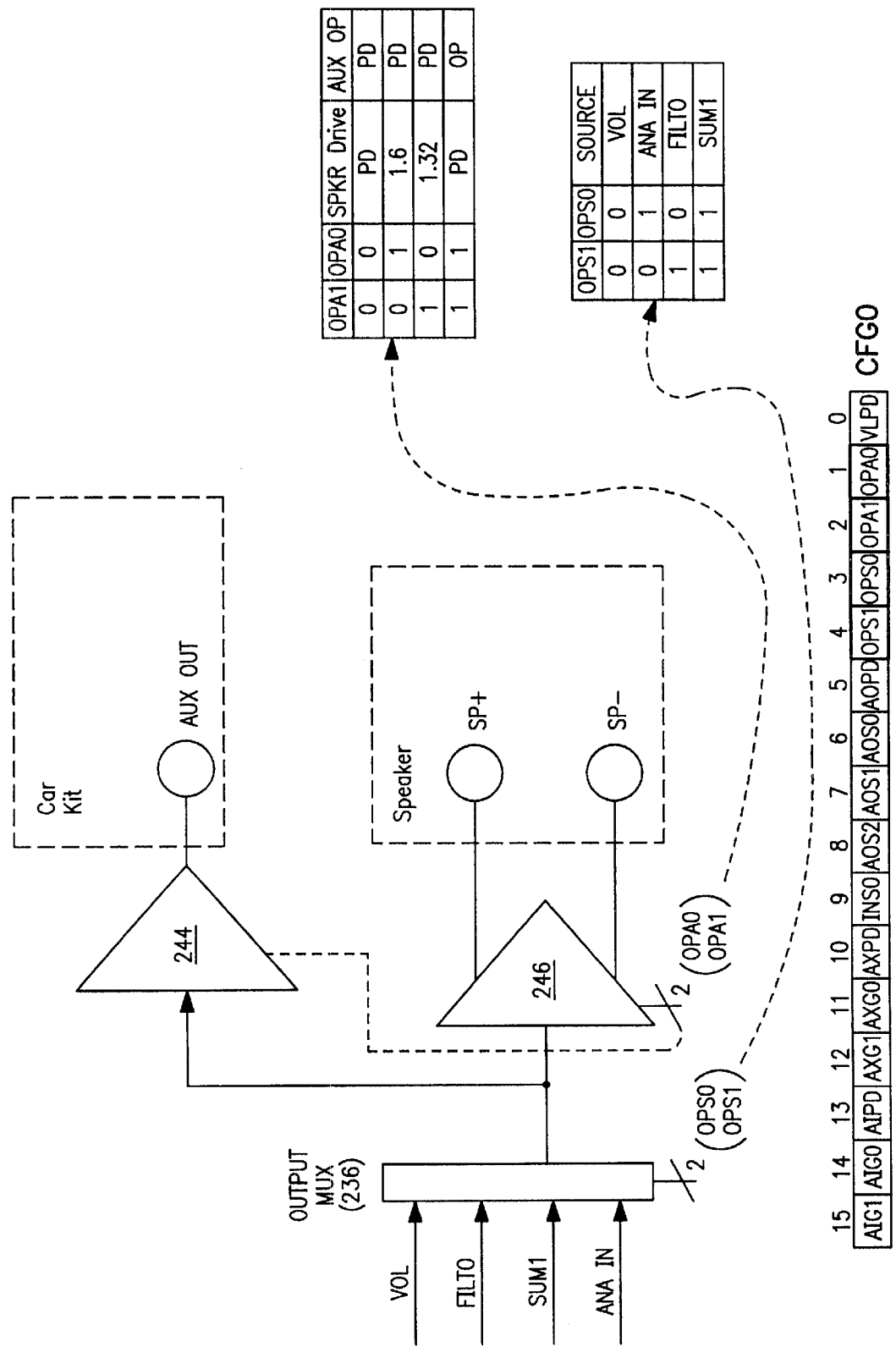

FIG. 5H illustrates a first output path of the analog recording and playback system 152. The first output path includes an analog output multiplexer (ANAOUT MUX) 234 and an output amplifier 242. Referring to FIGS. 3 and 5H, the signals coupled to the ANAOUT MUX 234 include FTHRU (output of amplifier 210), INP (output of INPUT MUX 218), VOL (output of volume control circuit 238), FILTO (output of low pass filter 224), SUM1 (output of SUM1 AMP 220), and SUM2 (output of SUM2 AMP 226). Control signals AOS0–AOS2, responsive to corresponding bits 6–8 of CFG0, determine the output of the ANAOUT MUX 234. The amplifier 242 amplifies the analog signal at its input and provides a balanced fully differential output. The amplifier 242 is coupled to the microphone inputs (MIC+ and MIC−) of the baseband circuitry 110 of FIG. 2. Control signal AOPD is coupled to the amplifier 242 for powering up/down the same. Bit 5 of CFG0 controls the state of the AOPD control signal.

FIG. 5I illustrates second and third output paths of the analog recording and playback system 152. Included are an output multiplexer (OUTPUT MUX) 236, variable gain amplifier 244, and speaker driver amplifier 246. Referring to FIGS. 3 and 5I, the signals coupled to the OUTPUT MUX 236 include VOL, FILTO, SUM1, and ANA IN. Control signals OPS0 and OPS1, responsive to bits 3 and 4 of CFG0, determine the output of the OUTPUT MUX 236. The analog signal at the output of the OUTPUT MUX 236 is either driven by the amplifier 244 or the speaker driver amplifier 246. Control signals OPA0 and OPA1, responsive to bits 1 and 2 of CFG0, are coupled to the amplifiers 244 and 246 to control the output path of the analog signal. If both the control bits are high, then amplifier 244 is operational to drive the analog signal to an auxiliary output (e.g., a car kit interface), and amplifier 246 is powered down. If the control bits (OPA0–OPA1) are "01" or "10", then amplifier 246 is operational at gains of 1.6 or 1.32, respectively, to drive a speaker (e.g., in a handset), and amplifier 244 is powered down. The two different gain levels are provided for driving different outputs, and may be modified or changed depending on design choice and the transducer to be driven. If both bits are low, then both amplifiers are powered down.

The circuits contained within the device 152 have been described in detail above. Exemplary signal paths and modes of operation are also described Applicant's co-pending U.S. patent application Ser. No. 09/184,454 entitled "A multiple message multilevel analog signal recording and playback system containing configurable analog processing functions", filed Nov. 2, 1998, assigned to the assignee of the present invention.

Further, it should be appreciated by those skilled in the art that the apparatus and method for achieving accurate temperature-invariant sampling frequencies of the present invention can be used with Applicant's co-pending U.S. patent application Ser. No. 09/501,699 entitled "Multiple message multilevel analog signal recording and playback system having memory array configurable for analog and digital storage and serial communication", filed Feb. 10, 2000, assigned to the assignee of the present invention having storage circuit 154 for storing analog and digital data, or, Applicant's co-pending U.S. patent application Ser. No. 09/184,454 entitled "A multiple message multilevel analog signal recording and playback system containing configurable analog processing functions", filed Nov. 2, 1998, assigned to the assignee of the present invention which utilizes a multilevel storage array for storing analog data, or, any sample data system.

The present invention for an apparatus and method for achieving accurate temperature-invariant sampling frequencies has been previously described in the exemplary environment of the analog processing circuit system 152, which as previously discussed is particularly described in Applicant's co-pending United States Patent Application entitled "A multiple message multilevel analog signal recording and playback system containing configurable analog processing functions", for explanatory purposes only. However, it should be appreciated that Applicant's invention for achieving accurate temperature-invariant sampling frequencies can be used with any sample data system.

Figure 6:
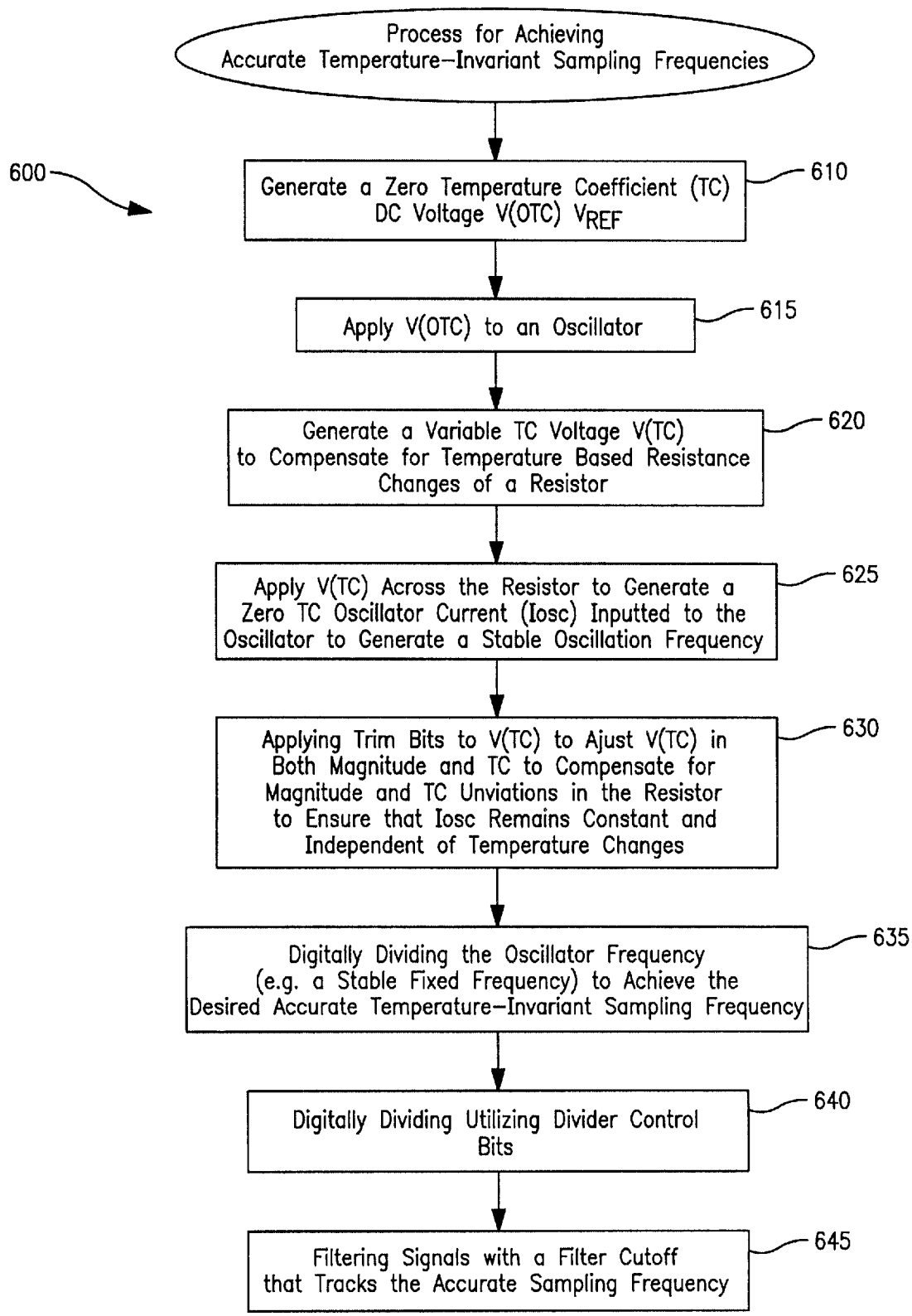
FIG. 6 is a flowchart illustrating a process for achieving accurate temperature-invariant sampling frequencies.

FIG. 6 is a flowchart illustrating a process 600 for achieving accurate temperature-invariant sampling frequencies. Such a process 600 can be used with, for example, sample data systems such as, a multiple message non-volatile multilevel analog signal recording and playback system. The process 600 first generates a zero temperature coefficient (TC) Direct Current (DC) voltage V(OTC) (block 610). The process 600 then applies V(OTC) to an oscillator (block 615). The process 600 also generates a variable TC voltage V(TC) that compensates for temperature coefficient (TC) variations of a resistor (block 620). V(TC) is applied across the resistor to generate a zero temperature coefficient (TC) oscillator current (Iosc) which is inputted to the oscillator to generate a stable oscillation frequency (Fosc) (block 625). Also, trim bits are applied to V(TC) to compensate for magnitude and TC variations in the resistor to ensure that Iosc remains constant and independent of temperature changes (block 630). The process 600 further digitally divides the oscillator frequency Fosc (e.g. a stable fixed frequency) to achieve the desired accurate temperature-invariant sampling frequency Fsample (block 635). In one embodiment, digitally dividing the oscillator frequency Fosc can be accomplished utilizing divider control bits (block 640). The process 600 then filters signals with a filter cutoff that tracks the accurate temperature-invariant sampling frequency Fsample (block 645).

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An apparatus for achieving accurate temperature-invariant sampling frequencies in a device, comprising:

an oscillator to generate an oscillation frequency;

a bandgap voltage generator to generate a zero temperature coefficient voltage reference (V(OTC)) that is independent of temperature and applied to the oscillator and a variable temperature coefficient voltage (V(TC)) that compensates for temperature coefficient variations of a resistor to which V(TC) is applied to produce a stable oscillator current (Iosc) that is likewise independent of the temperature coefficient variations of the resistor and that is applied to the oscillator such that the oscillator generates a stable temperature-invariant oscillation frequency;

a digital divider to digitally divide the stable oscillation frequency by a predetermined amount to produce an accurate temperature-invariant sampling frequency; and a filter to filter signals utilizing a filter cutoff that tracks the sampling frequency.

2. The apparatus of claim 1 wherein the bandgap voltage generator uses temperature coefficient (TC) selector trim bits to vary V(TC) to compensate for temperature coefficient (TC) variations in the resistor.

3. The apparatus of claim 1 further comprising an absolute voltage generator coupled to the bandgap voltage generator which uses voltage selector trim bits to vary the magnitude of V(TC) to compensate for magnitude variations in the resistor.

4. The apparatus of claim 3 further comprising a source follower operational amplifier coupled between the absolute voltage generator and the resistor to ensure that the oscillator current Iosc remains constant.

5. The apparatus of claim 1 wherein the digital divider utilizes divider control bits as the predetermined amount by which to digitally divide the stable oscillator frequency to achieve the accurate sampling frequency.

6. The apparatus of claim 1 wherein the filter is a lowpass switched capacitor filter.

7. The apparatus of claim 1 wherein the stable oscillator frequency is a fixed predetermined frequency.

8. The apparatus of claim 7 wherein the digital divider utilizes divider control bits to define a plurality of fixed predetermined amounts by which to digitally divide the fixed stable oscillator frequency to achieve a plurality of accurate sampling frequencies, respectively.

9. A method for achieving accurate temperature-invariant sampling frequencies in a device, comprising:

generating a variable temperature coefficient voltage (V(TC)) that compensates for temperature coefficient variations of a resistor to which V(TC) is applied to produce a stable oscillator current (Iosc) that is likewise independent of the temperature coefficient variations of the resistor;

applying the stable oscillator current (Iosc) to an oscillator such that the oscillator generates a stable temperature-invariant oscillation frequency;

digitally dividing the stable oscillation frequency by a predetermined amount to produce an accurate temperature-invariant sampling frequency; and filtering signals utilizing a filter cutoff that tracks the sampling frequency.

10. The method of claim 9 wherein temperature coefficient (TC) selector trim bits are used to vary V(TC) to compensate for temperature coefficient (TC) variations in the resistor.

11. The method of claim 9 wherein voltage selector trim bits are used to vary the magnitude of V(TC) to compensate for magnitude variations in the resistor.

12. The method of claim 9 further comprising ensuring that the oscillator current Iosc remains constant.

13. The method of claim 9 wherein digitally dividing further includes using divider control bits as the predetermined amount by which to digitally divide the stable oscillator frequency to achieve the accurate sampling frequency.

14. The method of claim 9 wherein filtering is accomplished using a lowpass switched capacitor filter.

15. The method of claim 9 wherein the stable oscillator frequency is a fixed predetermined frequency.

16. The method of claim 15 wherein digitally dividing further includes using divider control bits to define a plurality of fixed predetermined amounts by which to digitally divide the fixed stable oscillator frequency to achieve a plurality of accurate sampling frequencies, respectively.

17. A mobile communication system comprising:

a baseband circuit;

a processor coupled to the baseband circuit; and a recording and playback device coupled to the baseband circuit and the processor, comprising:

an analog processing circuit to process analog data, and an apparatus for achieving accurate temperature-invariant sampling frequencies in the recording and playback device comprising:

an oscillator to generate an oscillation frequency;

a bandgap voltage generator to generate a zero temperature coefficient voltage reference (V(OTC)) that is independent of temperature and applied to the oscillator and a variable temperature coefficient voltage (V(TC)) that compensates for temperature coefficient variations of a resistor to which V(TC) is applied to produce a stable oscillator current (Iosc) that is likewise independent of the temperature coefficient variations of the resistor and that is applied to the oscillator such that the oscillator generates a stable temperature-invariant oscillation frequency;

a digital divider to digitally divide the stable oscillation frequency by a predetermined amount to produce an accurate temperature-invariant sampling frequency; and a filter to filter signals utilizing a filter cutoff that tracks the sampling frequency.

18. The mobile communication system of claim 17 wherein the bandgap voltage generator uses temperature coefficient (TC) selector trim bits to vary V(TC) to compensate for temperature coefficient (TC) variations in the resistor.

19. The mobile communication system of claim 17 further comprising an absolute voltage generator coupled to the bandgap voltage generator which uses voltage selector trim bits to vary the magnitude of V(TC) to compensate for magnitude variations in the resistor.

20. The mobile communication system of claim 19 further comprising a source follower operational amplifier coupled between the absolute voltage generator and the resistor to ensure that the oscillator current Iosc remains constant.

21. The mobile communication system of claim 17 wherein the digital divider utilizes divider control bits as the predetermined amount by which to digitally divide the stable oscillator frequency to achieve the accurate sampling frequency.

22. The mobile communication system of claim 17 wherein the filter is a lowpass switched capacitor filter.

23. The mobile communication system of claim 17 wherein the stable oscillator frequency is a fixed predetermined frequency.

24. The mobile communication system of claim 23 wherein the digital divider utilizes divider control bits to define a plurality of fixed predetermined amounts by which to digitally divide the fixed stable oscillator frequency to achieve a plurality of accurate sampling frequencies, respectively.

* * * * *